(12) United States Patent
Reboh et al.

(10) Patent No.: US 11,901,194 B2
(45) Date of Patent: Feb. 13, 2024

(54) METHOD OF FORMING A POROUS PORTION IN A SUBSTRATE

(71) Applicant: COMMISSARIAT A L'ENERGIE ATOMIQUE ET AUX ENERGIES ALTERNATIVES, Paris (FR)

(72) Inventors: Shay Reboh, Grenoble (FR); Pablo Acosta Alba, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 203 days.

(21) Appl. No.: 17/124,787

(22) Filed: Dec. 17, 2020

(65) Prior Publication Data
US 2021/0210357 A1 Jul. 8, 2021

(30) Foreign Application Priority Data
Dec. 19, 2019 (FR) .................................... 19 15021

(51) Int. Cl.
*H01L 21/322* (2006.01)
*H01L 21/265* (2006.01)
*H01L 27/12* (2006.01)

(52) U.S. Cl.
CPC ........ *H01L 21/3226* (2013.01); *H01L 21/265* (2013.01); *H01L 27/1203* (2013.01)

(58) Field of Classification Search
None
See application file for complete search history.

(56) References Cited

U.S. PATENT DOCUMENTS

2011/0131542 A1   6/2011   Botula et al.

FOREIGN PATENT DOCUMENTS

WO   WO 2011/066035 A2   6/2011

OTHER PUBLICATIONS

French Preliminary Search Report dated Oct. 22, 2020 in French Application 19 15021 filed on Dec. 19, 2019 (with English Translation of Categories of Cited Documents &Written Opinion), 8 pages.
Samann, et al., "Pulsed Laser Porosification of Silicon Thin Films", Materials vol. 9, No. 7, Jun. 18, 2016, XP055728610, 12 pages.

*Primary Examiner* — Alexander G Ghyka
(74) *Attorney, Agent, or Firm* — Oblon, McClelland, Maier & Neustadt, L.L.P.

(57) ABSTRACT

The invention relates to a method for forming a porous portion in a substrate, an implantation of ions in at least one region of a layer, for example based on a semiconductor material, so as to form a portion enriched with at least one gas in the implanted region, and then a laser annealing of the nanosecond type so as to form a porous portion. The use of the ion implantation makes it possible to dissociate the deposition of the layer based on semiconductor material from the incorporation of gas. A great variety of porous structures can be obtained by the method. These porous structures can be adapted for numerous applications according to the properties sought.

20 Claims, 9 Drawing Sheets

METHOD OF FORMING A POROUS PORTION IN A SUBSTRATE

CROSS-REFERENCE TO RELATED APPLICATION

The present application claims priority to French Patent Application No. 19 15021, filed on Dec. 19, 2019. The entire contents of each of the foregoing are incorporated herein by reference.

TECHNICAL FIELD

The present invention relates to the field of methods for substrate surface modification, and more particular methods for forming a porous material. It can find particularly advantageous application in the formation of black silicon, for example for photovoltaics. In general terms, the field of microelectronic devices is aimed at. Microelectronic device means any type of device produced with microelectronic means. These devices encompass in particular, in addition to devices with a purely electronic purpose, micromechanical or electromechanical devices (MEMS, microelectromechanical systems, NEMS, nanoelectromechanical systems, etc.) as well as optical or optoelectronic devices (MOEMS, micro-opto-electro-mechanical system, . . . ).

PRIOR ART

Porous materials are at the present time the subject of numerous researches for various applications. For example, these materials make it possible to increase the sensitivity of certain chemical analyses, and in particular in gas sensors, by virtue of the high ratio of their specific surface area to their volume. The porosity of these materials gives rise moreover to a reduction in their thermal conductivity, which is particularly advantageous for applications of energy conversion by thermoelectricity. Among porous materials, and more particularly porous semiconductor materials, porous silicon is studied as an anodic material in lithium-ion batteries of high energy density. This is because it is known that silicon can expand up to 270% during the insertion of lithium, which can cause a mechanical fracture of the silicon. When the silicon is porous, the stability thereof during charging-discharging cycles of the battery is increased, the porosity facilitating the expansion of the silicon.

Porous silicon is generally produced by wet chemical etching of sheets, commonly referred to as wafers, of crystalline silicon. Among the wet chemical etching methods, a usual method is anodic etching, wherein a silicon wafer, connected to a positive electrode, is immersed in an aqueous solution of hydrofluoric acid. This method allows a dissolution of the silicon in order to create a homogeneous porous structure. The pores produced are formed over several microns of depth, with diameters of between a few nanometres and a few micrometres.

In another wet chemical etching method, the surface of a silicon wafer is covered with a fine layer of metal, for example with a thickness of less than 10 nanometres (nm), in order to facilitate the etching of the silicon by an aqueous solution of hydrofluoric acid and hydrogen peroxide. Depending on the metal and the doping of the silicon, local oxidation-reduction reactions take place and make it possible to obtain various porosities using different etching rates.

Other wet chemical etching methods use hydrofluoric acid and a chemical oxidant in a small quantity, such as nitric acid or chromium trioxide, in order to produce superficial porous films on the silicon wafer. However, the thickness of the porous films produced is limited to a thickness of 100 nm.

The methods stated above use baths of hydrofluoric acid, which is a very corrosive and toxic compound, and require a great deal of rinsing, which involves the treatment of a large volume of an effluent that is hazardous for the environment and health. Furthermore, wet chemical etching methods are generally isotropic, which limits the diversity of porous structures that it is possible to obtain.

The document C. Samann, et al., Pulsed Laser Porosification of Silicon Thin Films, Materials, 9, 7, 509, 2016, describes a physical method for forming a layer of porous silicon. This method comprises a deposition by sputtering of a layer of amorphous silicon, this layer comprising argon coming from the sputtering gas. Alternatively, a plasma-assisted chemical vapour deposition of a layer of amorphous silicon may be carried out, this layer then comprising hydrogen coming from the silane precursor. The layer of silicon deposited is next exposed to a pulsed laser, so that the silicon changes from the solid state to the liquid state, thus giving rise to the elimination of the bubbles of argon or dihydrogen gas, and solidifies forming a thin layer of porous silicon.

In this method, the gases are incorporated in the layer of silicon when it is deposited. The gases are therefore incorporated in the whole of the layer of silicon deposited. Furthermore, the porous structures that it is possible to obtain by this method remain limited.

One object of the present invention is therefore to propose an improved method for forming a porous portion in a substrate. In particular, a non-limitative object of the present invention is to propose a method for forming various porous structures in a substrate.

The other objects, features and advantages of the present invention will emerge from an examination of the following description and the accompanying drawings. Naturally other advantages may be incorporated.

SUMMARY

To achieve this objective, according to one embodiment, a method for forming a porous portion in a substrate is provided, the method comprising:
  provision of a substrate comprising a layer,
  an implantation of ions chosen from hydrogen ions and noble gas ions in at least one region of the layer, the implanted region being situated at an implantation depth in the layer, so as to form at least one portion enriched with at least one gas in the implanted region, and then
  a laser annealing of the nanosecond type so as to bring about, from the implanted region, at least one from the formation and the development of a porous portion in the substrate.

Preferably, the porous layer extends from the surface of the substrate.

The use of ion implantation makes it possible to dissociate the deposition of the layer from the incorporation of gas. This has several advantages. Ion implantation can be used to introduce gas ions in any type of material, and in particular in a semiconductor material, including for crystalline or even monocrystalline semiconductors, or a dielectric material.

The nature of the chemical elements of the ions implanted is furthermore not limited to ions coming from, or compatible with, a method for depositing the layer. A great variety of gas molecules, or even a mixture of these gases, can thus be incorporated in the layer. Since the size distribution of the pores formed is dependent on the nature of the gas implanted, the method makes it possible to adjust the porosity of the layer in a pore size range that is more extensive than the prior art.

Furthermore, according to the parameters of the ion implantation, the depth of implantation in the layer can be adjusted, and in particular according to the chemical nature of the ions, the implantation energy and the nature of the material of the layer.

It will therefore be understood that a great variety of porous structures can be obtained by the method. These porous structures can be adapted for numerous applications according to the properties sought. Furthermore, this method is entirely compatible with the majority of integration technologies and methods, in particular in micro- and nano-manufacture, and in particular with the device production methods comprising a substrate, for example made from a semiconductor material.

The porous portion may extend from the implanted region to the exposed surface of the substrate. Preferably, the layer is on the surface of the substrate, and the porous portion is formed in a portion of the layer from the implanted region as far as an exposed surface of the layer.

Optionally, the method may further comprise the application of a mask to a fraction of an exposed surface of the substrate, prior to the ion implantation. The method may furthermore comprise a removal of the mask after the ion implantation. According to an example, the mask is removed between the ion implantation and the laser annealing. By virtue of the application of a mask, the ion implantation can be carried out at a given depth and in at least a fraction of the layer. The porous portion formed in the layer is thus localised, or even divided or in an equivalent fashion discontinuous, in a principal extension plane of the layer. The method according to this feature makes it possible to further increase the variety of porous structures that it is possible to obtain.

Another aspect is a microelectronic component including at least one porous portion.

BRIEF DESCRIPTION OF THE FIGURES

The aims, objects, features and advantages of the invention will emerge more clearly from the detailed description of several embodiments thereof, illustrated by the following accompanying drawings.

The drawings are given by way of examples and are not limitative of the invention. They constitute schematic outline representations intended to facilitate understanding of the invention and are not necessarily to the scale of practical applications. In particular, the thicknesses and the relative dimensions of the substrate, layer, region or portions illustrated do not represent reality.

DETAILED DESCRIPTION

Before beginning a detailed review of embodiments of the invention, optional features, which may optionally be used in association or alternatively, are stated below:
- the depth of implantation may be less than the total thickness of the layer,
- the region implanted may have a thickness less than the thickness of the layer,
- during the ion implantation, a mixture of ions of distinct chemical elements may be implanted so as to form the at least one portion enriched with a plurality of gases. The nature of the gas implanted is one of the parameters for modulating the diameter and density of the pores of the porous portion obtained,
- during the ion implantation, the ions may be ions chosen from hydrogen ions and noble gas ions, the noble gas ions being chosen from helium, neon, argon and xenon ions,
- during the ion implantation, the ions may be ions chosen from hydrogen ions and helium ions,
- the ions may be implanted at a temperature of between −200° C. and 1200° C., preferably between 20° C. and 450° C. According to the temperature of the ion implantation, the features of the porous portion obtained may be modulated, and in particular the diameter and density of the pores formed may in particular be modulated,
- the method may furthermore comprise a thermal annealing between the ion implantation and the laser annealing, and preferably the thermal annealing is carried out at a temperature higher than the ion implantation temperature, preferably the temperature of the thermal annealing is between 200° C. and 1200° C., preferably between 350° C. and 1100° C. The thermal annealing may in particular modify the porous portion obtained by the method,
- the method comprises a plurality of ion implantations, preferably successive. According to one example, at least one ion implantation, among the successive ion implantations, may be configured to implant a mixture of ions of distinct chemical elements, the method may comprise a plurality of ion implantations, wherein the chemical elements of the ions and/or the relative proportions thereof between ions of distinct chemical elements vary between the various ion implantations. Thus the ions implanted may be ions of different chemical elements. For example, hydrogen ions are implanted in one implantation, and helium ions are implanted in another implantation. In the case of the implantation of a mixture of ions, the relative proportions between the various ions of the mixture may vary between several implantations. Alternatively or in a complementary fashion, in at least one implantation, a single type of ion may be implanted, and in at least one other implantation a mixture of ions may be implanted. Alternatively or in a complementary fashion, several mixtures of ions may be implanted, the mixtures varying between the various implantations, for example by the chemical elements of the ions, or even the relative proportion thereof between ions of distinct chemical elements, at least one from the several ion implantations may be performed at a different implantation depth with respect to the implantation depths of the other ion implantations. Synergically, implanting various ions or of various mixtures of ions, at different depths in the layer, makes it possible in particular to form a porous portion having a porosity gradient, at least one from the several ion implantations is configured to implant a different dose with respect to the implanted doses of the other ion implantations. According to one example, ions of the same chemical elements are implanted, the implanted dose varying between the various implantations, the laser annealing of the nanosecond type may be implemented at a predetermined energy density, the predetermined energy density being chosen by means of a curve representing, as a function of the energy density, a signal proportional to a roughness of the porous portion obtained, and preferably a surface roughness, the curve having at least one increase in said signal for a range of energy densities, the predetermined energy density being chosen in this range. The increase in said signal may more particularly be caused by the formation of the porous portion, the laser annealing may be performed at a wavelength of between 200 nm and 400 nm, the laser annealing may comprise laser pulses having a duration of between 1 ns and 1000 ns, the layer may be based on a semiconductor material, preferably the semiconductor is crystalline, or even monocrystalline, the semiconductor material may be based on monocrystalline silicon, when the substrate is based on monocrystalline silicon, the implantation of ions chosen from hydrogen ions and helium ions is performed at an implantation energy of between 30 and 40 keV and for an implanted dose of between $1.10^{16}$ and $5.10^{16}$ atoms/cm², and wherein the laser annealing is performed at a fluence greater than 3 J/cm², when the substrate is based on monocrystalline silicon, the implantation of helium ions may be performed at an implantation energy of between 30 and 40 keV and at an implanted dose of $4.10^{16}$ atoms/cm², and the laser annealing may be performed at a fluence greater than 3 J/cm², the porous portion comprises pores having an inner surface, as is clear and unambiguous from the following description, the method comprises a surface treatment of the porous portion comprises a thermal oxidation of the inner surface of the pores of the porous portion, as is clear and unambiguous from the following description, the method comprises a surface treatment of the porous portion comprising a deposition of a dielectric material or of a semiconductor material, on said inner surface, as is clear and unambiguous from the following description.

A parameter "substantially equal to/greater than/less than" a given value means that this parameter is equal to/greater than/less than the given value to within plus or minus 10%, or even to within plus or minus 5%, of this value.

In the following description, the thicknesses of layer, region or portion and the depths are generally measured in a vertical direction, parallel to the stacking direction and perpendicular to the main extension plane of the substrate, of the layer, of the sublayer or of the portion.

A substrate, layer, region or portion "based" on a material A means a substrate, layer, region or portion comprising this material A. The material A may consist of a single chemical element or a plurality of chemical elements.

"Enriched portion" means that the portion comprises, as an additional element, the at least one gas coming from the implanted ions.

Porosity of a layer, of a sublayer, or a region or of a portion means the proportion by volume of the pores per unit volume in the layer, sublayer, region or portion.

In general and as known to a person skilled in the art, open porosity designates the porosity of a substrate or of a layer in communication with the environment of the substrate or of the layer, the pores being interconnected with each other. In the context of the invention, the energies are given in electron volts, for which 1 eV≈$1.602\times10^{-19}$ J, in the international system of units.

Figure 1:
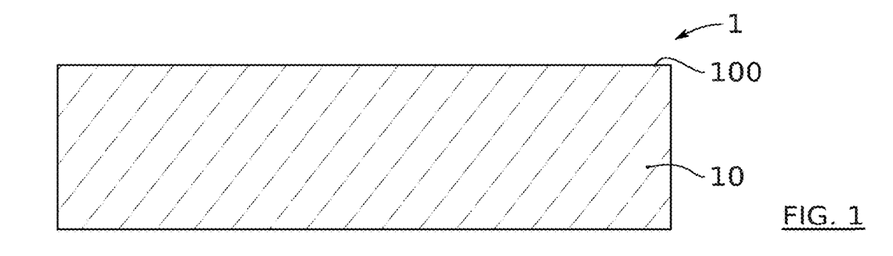
FIG. 1 shows a schematic view in a cross section of the layer of a substrate used in the method according to one embodiment.

The method is now described with reference to FIGS. 1 to 4E. The method first of all comprises the provision of a substrate 1, as illustrated in FIG. 1. This substrate 1 comprises a layer 10. Note that in the figures only the layer 10 of the substrate 1 is shown. The substrate 1 may nevertheless be in the form of a stack of a plurality of layers, for example based on various materials. The substrate 1 may for example comprise the layer 10 and a surface layer of oxide, and in particular a thin layer. According to an alternative or supplementary example, the substrate 1 comprises a layer of doped semiconductor, and of a non-doped semiconductor, the layer 10 being able to be one or other or both of these layers. According to another example, the layer 10 may be situated on the surface of the substrate 1 and have an exposed surface 100.

The layer 10 may more particularly be based on a semiconductor material, or a dielectric material, or a metal material. The dielectric material may be an oxide, and in particular a semiconductor oxide, for example a silicon oxide, and/or be based on any semiconductor, and for example based on silicon, germanium, gallium arsenide or silicon carbide, gallium nitride and indium phosphide. The semiconductor is preferably crystalline, or even monocrystalline. The layer 10 may furthermore consist solely of the semiconductor material, ignoring any impurities related to the production of the semiconductor. In the remainder of the description, reference is made non-limitatively to the example wherein the layer 10 is situated on the surface of the substrate 10 and wherein the layer 10 is based on a semiconductor material.

The implantation of ions is described with reference to FIGS. 2A to 2E. The implantation of ions is implemented on the substrate 1 so as to implant ions in a region 11 of the layer 10 in a way that is localised in a direction perpendicular to a main extension plane of the layer 10. This region 11 extends more particularly parallel to the main extension plane of the layer 10. The implantation of ions is furthermore configured so that the greatest implanted concentration of ions, referred to as the implanted region 11, is situated at a depth P from the exposed surface 100, here of the layer 10, or of the substrate 1 or of the stack according to circumstances. For this purpose, the layer 10 is subjected to a flow of ions at an implantation energy and so as to implant a dose of ions in the layer 10. Note that in the figures the depth P is defined as the depth to which the implanted region 11 extends. The depth P may alternatively be defined as far as a midplane of the implanted region 11, this midplane being parallel to the main extension plane of the layer 10.

The implantation of ions thus causes the formation of a portion enriched with at least one gas at the implanted region 11. This gas-enriched portion may be in the form of a microstructure of bubbles 110, the bubbles referring to a plurality of volumes enclosed in the material, these volumes preferably comprising the at least one gas. Alternatively, the gas-enriched portion may not be in the form of bubbles following the implantation step, for example the gas is diffused in this layer. The bubbles 110 may in particular be formed during an annealing, described in more detail below. Hereinafter, the generic term microstructure 110 is designated to describe these various embodiments of the gas-enriched portion.

According to parameters of the ion implantation, the bubbles 110 will have various morphologies and various bubble size and density distributions. The parameters of the implantation of ions mainly comprise the chemical nature of the implanted ions, and in particular the chemical element of the implanted ions, the implantation temperature and more particularly the temperature of the substrate 1 at the time of implantation, the implantation current, the implantation energy and the implanted dose. Note that tools for calculating stopping and range of ions in matter (which can be abbreviated to SRIM) may be used for determining the penetration of the ions in the matter. Note furthermore that, for a type of implanted ion, an implantation energy and an implanted dose, the chemical nature of the semiconductor may furthermore influence the microstructure 110 formed.

The implantation energy influences in particular the depth P of the gas-enriched portion. The implantation energy may more particularly be between 0.5 keV and 1 MeV and preferably between 0.5 and 200 keV. The ion implantation may more particularly be performed at a temperature of between substantially −200° C., corresponding to the temperature of liquid nitrogen, and 1200° C. The ion implantation may more particularly be performed at a temperature of between 20° C. and 450° C. The dose of implanted ions may be between $10^{15}$ and $10^{18}$ ions/cm².

Figure 2A:
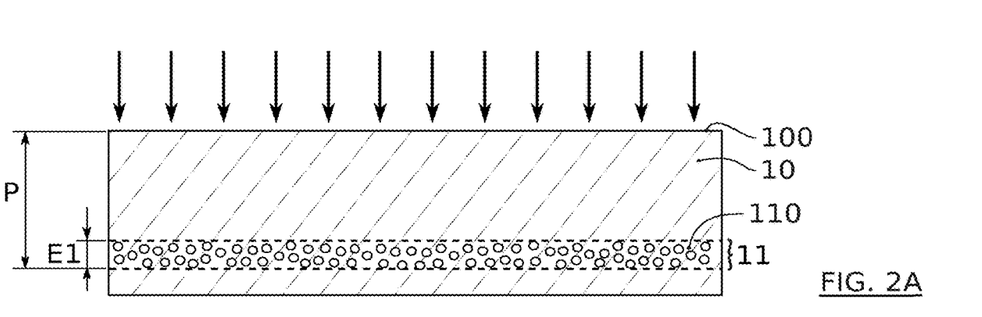
FIGS. 2A to 2F illustrate the implantation of ions, according to several embodiments of the method according to the invention, in a portion of the layer illustrated in FIG. 1.

According to a first example illustrated in FIG. 2A, ions are implanted in the layer 10 through the surface 100 thereof, as shown by the arrows, at a region 11, at a depth P and over a thickness $E_1$. According to one example, the implanted region 11 may extend from the depth P to the surface 100 of the layer 10, or even of the substrate 1.

Figure 2B:
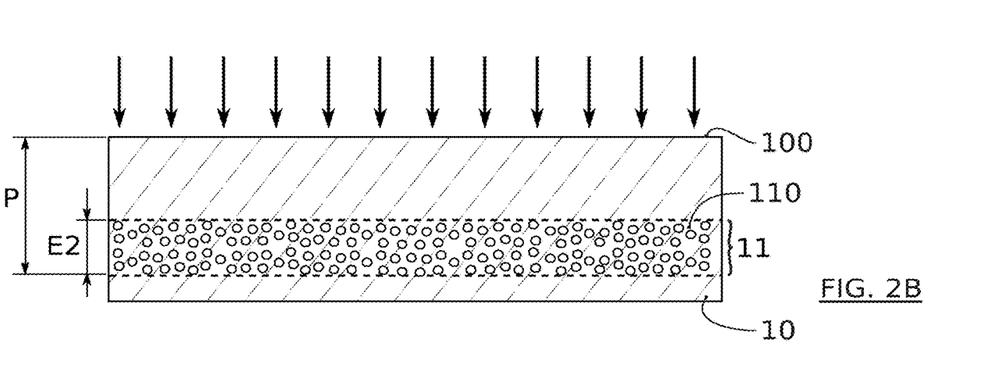

The thickness of the implanted region 11 may be increased, as illustrated for example illustrated in FIG. 2B, by increasing the implanted dose and/or by performing multiple implantations, for example at different implantation energies. For an implantation performed at a first energy, the following implantation or implantations may be performed at lower and/or higher energies such that the distribution profiles of the implanted ions overlap by at least 10% of the implanted dose.

Ions of distinct chemical natures, and more particularly of distinct chemical elements, may moreover be implanted, or even a mixture of ions of distinct chemical natures may be implanted. The method thus allows the incorporation of various gases, or even of a mixture of gases, in the enriched portion 11. According to the nature of the gas, the microstructure 110, for example the diameter of the bubbles, may vary. The ions may be chosen from hydrogen ions, and/or noble-gas ions, or in an equivalent fashion rare gas. Noble-gas ions are chosen from ions of helium, neon, argon, krypton, xenon and radon. Preferably, ions of helium, argon, neon, xenon or a mixture thereof may be implanted.

Figure 2C:
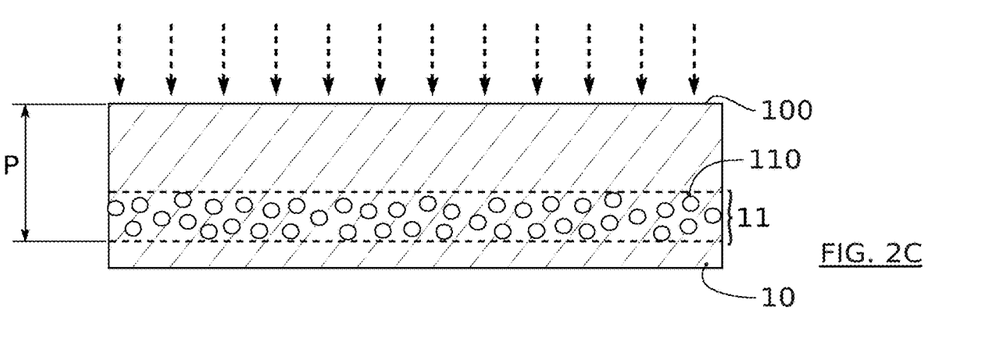

According to a third example illustrated in FIG. 2C, ions are implanted at a depth P in the layer 10, as shown by the arrows in broken lines, these ions being a distinct chemical element with respect to the ions implanted in the first example illustrated by FIG. 2A. This difference in chemical element may in particular have an influence on the morphology of the implanted region 11. For example, the bubbles 110 may have a diameter greater than that of the bubbles 110 foil ted in the first example.

Note that, in the previously described examples, the depths P may vary from one example to another, and for example according to the implantation energy used.

Furthermore, the method may comprise a plurality of ion implantations, preferably successive. These ion implantations may be configured so as to form microstructures in a plurality of regions 11 in the layer 10. These regions being able to be in contact with each other in a direction perpendicular to a main extension plane of the implanted region 11. Microstructures in a plurality of regions 11 may thus be formed. These microstructures may have various morphologies and various distributions of size and density of bubbles according to the implantation parameters.

Figure 2D:
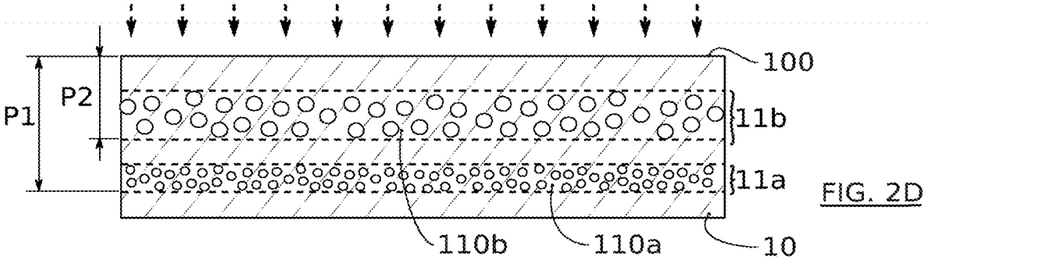

By way of example, a first ion implantation may be performed. As illustrated in FIG. 2D, a first microstructure 110a may be obtained in an implanted region 11a, at a depth $P_1$ of the layer 10. Following this first implantation, a second ion implantation configured so as to obtain a second microstructure 110b, in an implanted region 11b at a depth $P_2$ of the layer 10, and having a morphology distinct from the first microstructure 100a. According to the example illustrated, the second implantation may be performed at a second dose higher than that of the first implantation. In an alternative or complementary fashion, the implantation temperature in the first or second implantation may be modified so as to change the microstructure 110b. The nature of the ions implanted in each region 11 may be modified in an alternative or complementary fashion. In an implanted region 11b, it is possible to form bubbles 110b with a diameter distinct from that of the bubbles of an implanted region further away from the surface 100 of the layer 10, in a direction perpendicular to the main extension direction of the substrate. According to the example illustrated in FIG. 2D, the diameter of the bubbles 110b is greater than that of the bubbles 110a of an implanted region further away from the surface 100 of the layer 10. Provision can be made for the diameter of the bubbles 110b to be less than that of the bubbles 110a of an implanted region further away from the surface 100 of the layer 10, the implantation of the first region 11a being for example performed at a higher implantation temperature than the implantation of the second region 11b.

Figure 2E:
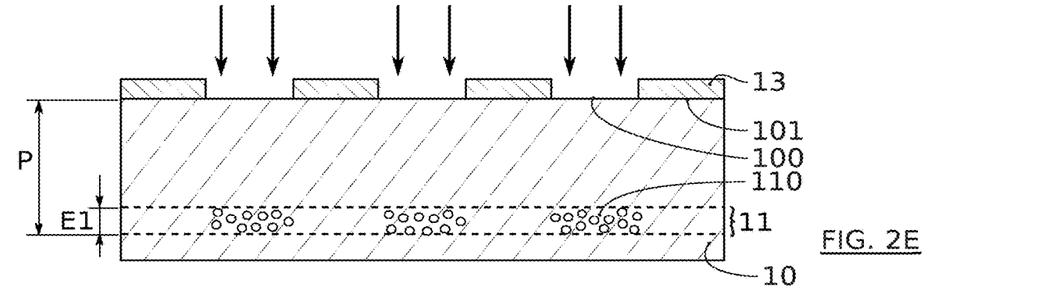

The method may further comprise the application of a mask 13 on a fraction 101 of the surface 100 of the layer 10, in order to form one or more implanted regions 11. As illustrated in FIG. 2E, the implanted region may in particular be divided, or in an equivalent fashion discontinuous, in the main extension plane of the layer 10. The parameters of the ion implantation may be modified as stated above. The mask may be configured so that only the non-masked fraction of the surface 100 is exposed to the flow or flows of ions during the implantation. Thus the implanted region 11, or even the plurality of implanted regions 11, may extend in the main extension plane of the layer 10, at a depth P, opposite the non-masked fraction of the surface 100. According to one example, a mask 13, based on silicon nitride, can be used. Following the ion implantation or implantations, the mask 13 can be removed. In a particular embodiment, the mask 13 is removed following the ion implantation or implantations and before thermal annealings or laser annealings are performed on the substrate 1.

Figure 2F:
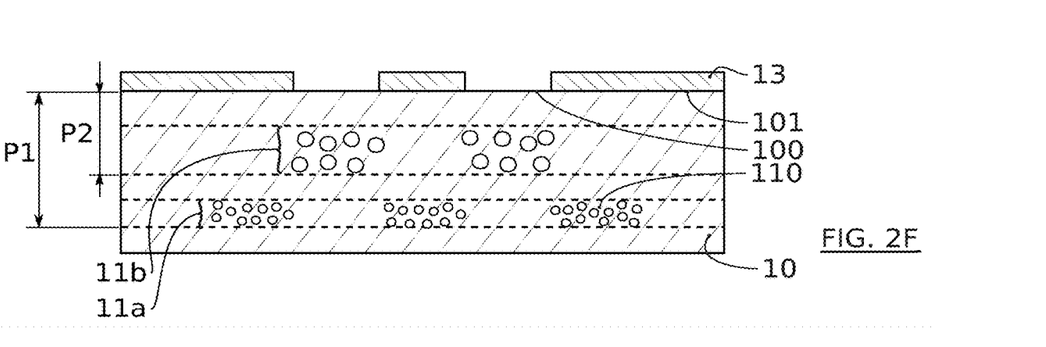
Figure 3:
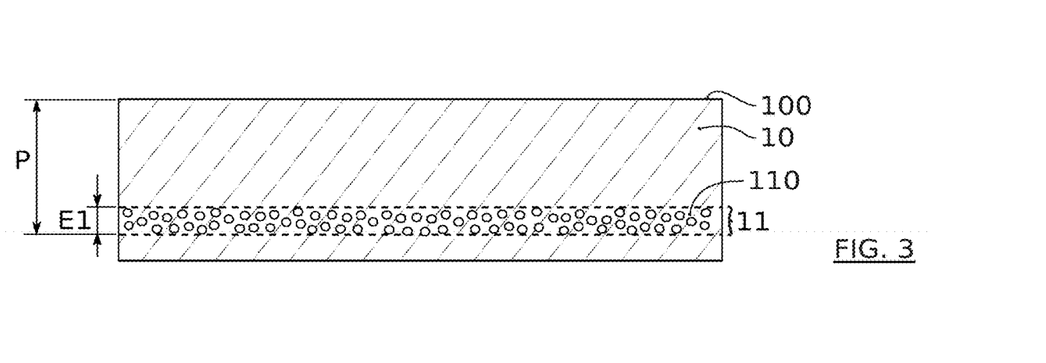
FIG. 3 illustrates a thermal annealing according to one embodiment of the method according to the invention, performed on the layer, after the ion implantation illustrated in FIG. 2A.
Figure 4A:
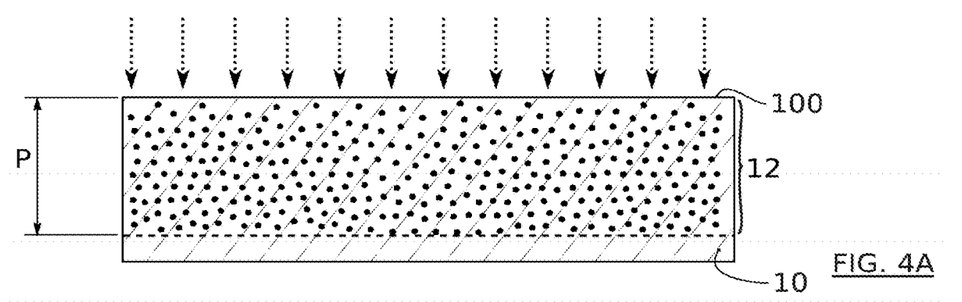
FIGS. 4A to 4E illustrate the laser annealing, according to several embodiments of the method according to the invention, performed on a layer, after the ion implantations illustrated by FIGS. 2A to 2D and 2F.
Figure 4B:
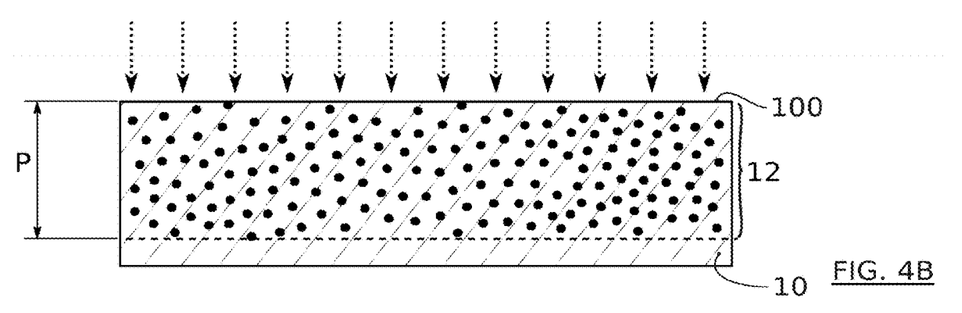
Figure 4C:
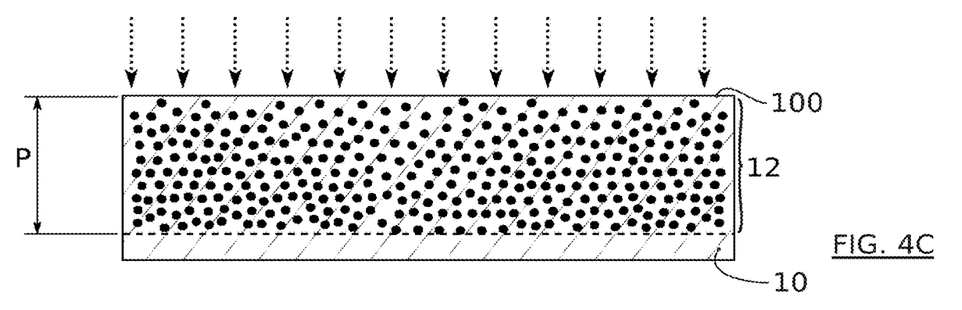
Figure 4D:
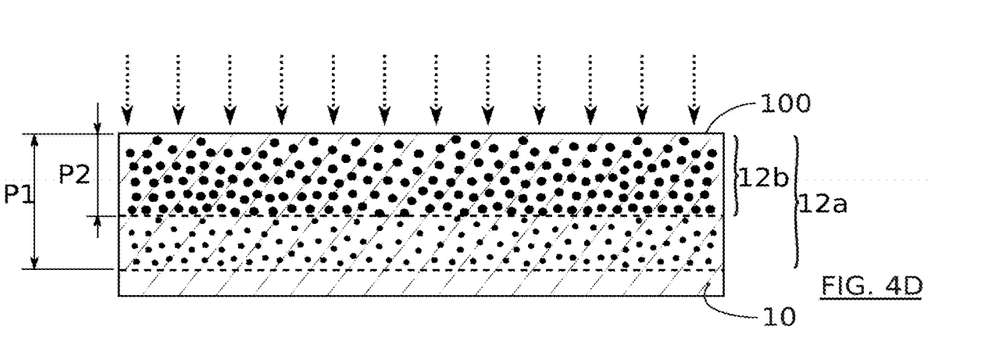
Figure 4E:
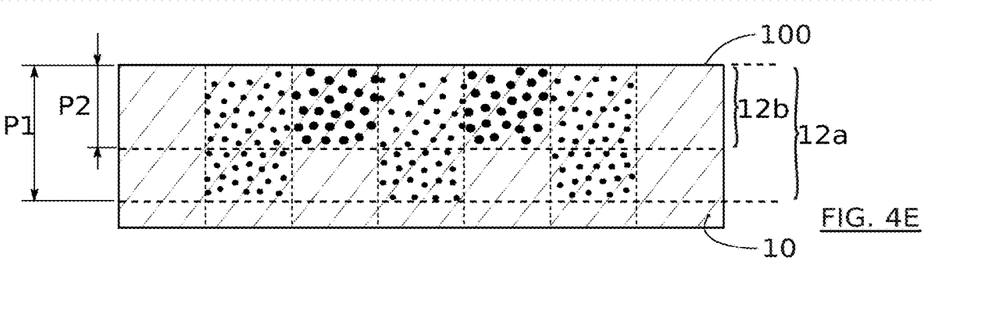

Since the method may comprise a plurality of ion implantations, the method may further comprise a plurality of applications and a plurality of removals of a mask 13, for example for each of the ion implantations. The parameters of the ion implantation may be modified between the various ion implantations. Regions 11a, 11b implanted in a divided fashion may thus be formed at a plurality of depths $P_1$ and $P_2$ of the layer 10, as illustrated in FIG. 2F. The implanted regions 11a, 11b may further have different microstructures 110a, 110b.

The method may comprise a thermal annealing of the substrate 1, so as to modify the microstructure formed by implantation. This thermal annealing may be performed following one implantation or a plurality of implantations. Furthermore, the annealing may be performed between a plurality of implantations. This thermal annealing may be configured in order to form the microstructure of bubbles 110 from the gas-enriched portion, or to modify the morphology of the bubbles 100 previously formed. In particular, a thermal annealing of the layer 10 of the substrate 1 may cause an enlargement of the bubbles 110, according to the example illustrated by the change from FIG. 2A to FIG. 3.

For this purpose, the thermal annealing can be performed at a temperature of between 200° C. and 1200° C., in particular at a temperature higher than an ion implantation temperature. Preferably, the temperature of the thermal annealing is between 350° C. and 1100° C. By way of example, the diameter of neon bubbles implanted at 250° C., for an implanted dose of around $10^{16}$ atoms/cm$^2$, and following a thermal annealing of 5 hours at 1100° C., may increase up to 200 nm, as described in the document Caracterização da implantação de Ne em Si (100), Suzana Bottega Peripolli, Federal University of Rio Grande do Sul, 2007.

Following the ion implantation, or even following any thermal annealing, the method next comprises a laser annealing of the substrate 1. The laser annealing is now described with reference to FIGS. 4A to 4E. This annealing is said to be pulsed, that is to say the exposed surface 100 of the layer 10 is subjected to a laser radiation intermittently by at least one laser pulse or a plurality of pulses. The exposure to the laser radiation causes a fusion of the semiconductor material at least in a portion 12. Following this exposure to the laser radiation, the at least one portion 12 of the semiconductor material solidifies, while keeping pores in order to obtain the porous portion 12'. Depending on the energy, the duration and the number of laser pulses, the features of the porous portion 12' can be modulated.

The portion 12 extends in the layer 10 at the exposed surface 100 of the substrate 1. The portion 12, and therefore the corresponding porous portion 12', is dependent on the microstructure formed during the implantation, or even following one or more possible thermal annealings. More particularly, the features of the porous portion 12' obtained may be dependent on the distribution of the bubbles 110 previously formed, and in particular the number and diameter thereof, and the depth and thickness of the microstructure 110. As an alternative, the laser annealing may cause the formation of bubbles 110 from the gas-enriched portion, the features of which are dependent on the parameters of the implantation, or even on any thermal annealing. For example, from the microstructures described in FIGS. 2A to 2D and 2F, it will be understood that the diffusion portions 12 form, or even the portions 12a and 12b, and therefore the corresponding porous portions, illustrated in FIGS. 4A to 4E.

Pulsed laser annealing is here a laser annealing of the nanosecond type, that is to say the duration of the laser pulses is in particular between 1 ns ($10^{-9}$ seconds) and 1000 ns. The use of a laser annealing of the nanosecond type makes it possible firstly to cause a fusion of only the portion 12, and secondly to avoid the period during which the semiconductor material is molten not being too long and causing reblocking of the cavities. Furthermore, laser annealing of the nanosecond type makes it possible to limit or even avoid an excessive increase in the temperature of the substrate 1. The risk of degradation of the substrate 1 is therefore minimised, or even avoided. Preferably, the duration of the pulses is between 50 and 250 ns, and more preferentially is substantially equal to 160 ns.

The wavelength of the pulsed laser annealing is preferably chosen so as to lead to a high absorption of the laser radiation by the material. A laser with a wavelength of less than 400 nm is for example chosen in the case where the layer 10 or even the substrate 1 is made from silicon, germanium or silicon-germanium. Preferably, the laser annealing is performed at a wavelength of between 200 nm and 400 nm. In the near UV domain, the radiation is more energetic than in the visible, and allows a concentration of the energy in a superficial part of the substrate 1, and in particular at the layer 10. Thus the risk of deterioration of the substrate beyond the layer 10, or even beyond the implanted region 11, is minimised or even avoided.

The energy density of the laser annealing, which may be designated energetic fluence F, may furthermore be chosen so as to modify the microstructure of the porous portion 12' obtained, and in particular the porosity and the surface state of the porous portion 12'. For this purpose, during the development of the invention, the influence of the fluence F of the laser annealing was studied on a layer 10 comprising a region 11 implanted according to a particular embodiment of the method. An implanted region 11 was formed in a layer 10 of monocrystalline silicon on a plurality of substrates 1, by implantation of a mixture of hydrogen and helium ions at an energy of between 30 and 40 keV, at a total dose of $2.10^{16}$ ions/cm$^2$. Each of the substrates 1 was then irradiated with a fluence F of between 0.4 J/cm$^2$ and 3.125 J/cm$^2$, in steps of 0.025 J/cm$^2$.

The surface state of each substrate 1 can be evaluated by means of a measurement of a signal proportional to the roughness of this surface. This signal may be the diffuse background noise (H, also known as "haze" in the terminology commonly used) commonly employed by a person skilled in the art, corresponding to the intensity of the light diffused by the surface of the layer. By way of example, in accordance with ASTM D4039, the Haze can be defined as the numerical difference between the specular reflection at 60° and the specular reflection at 20°. The measurements of Haze were performed by means of the Surfscan® SP2 inspection tool from the company KLA-Tencor.

A curve of calibration of the haze H as a function of the fluence F of the laser annealing can be obtained. This calibration curve is described hereinafter with reference to FIG. 5, for a silicon substrate implanted in accordance with the previously stated parameters. This curve may present at least one increase in the Haze from a fluence value. This increase can be explained by the generation of the porous portion causing an increase in the roughness of the surface 100. This curve can therefore be used to give an indication of the fluence F of the laser annealing to be used. Note that the fluence F of the laser annealing to be used may vary according to the nature of the substrate 1, and for example according to the material of the layer 10. Note that, as an alternative or in addition, a characterisation by scanning electron microscopy or transmission electron microscopy may be carried out.

Figure 5:
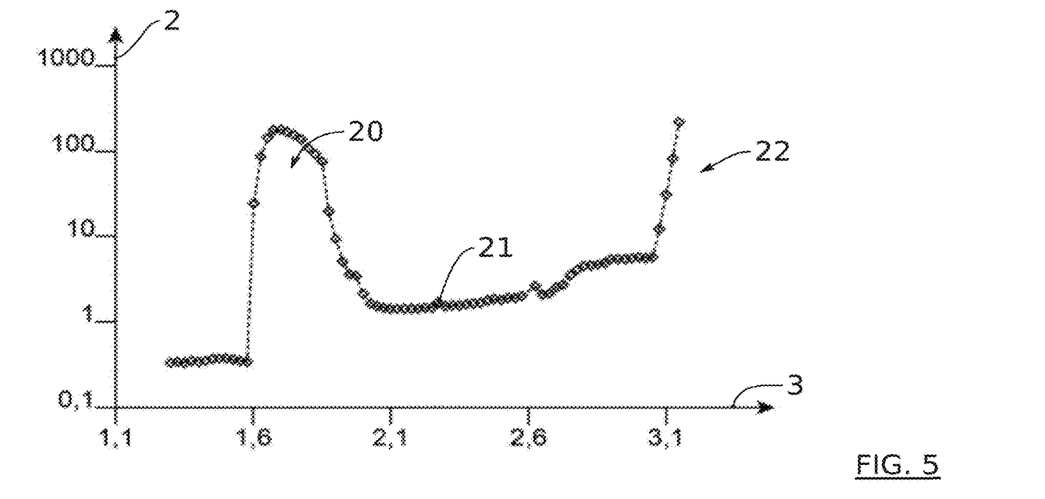
FIG. 5 shows a graph of the change in the diffuse background noise (H, also known as Haze) as a function of the fluence (F, in $J/cm^2$) of the laser annealing, for a porous silicon portion according to a particular embodiment of the invention.

According to the example illustrated, this curve may in fact present a first Haze regime 20 at low fluence F, observing an intensity peak of the Haze for fluences F substantially lying between 1.6 and 1.9 J/cm². This peak appears to be related to an increase in the surface roughness because of the formation of surface structures. These surface structures, observed under scanning electron microscopy, may be associated with an onset of localised fusion of the surface 100 of the substrate 10 causing the roughness.

For fluences F greater than 2 J/cm², it is observed by scanning electron microscopy that a reduction in the Haze is obtained, in a second intermediate regime 21, which may be related to a fusion and homogeneous recrystallisation of the semiconductor of the layer 10 following a total fusion of the surface 100 during the laser annealing.

For fluences F greater than 3 J/cm², a new intensity peak of the Haze is observed, at a third regime 22. A surface texturing phenomenon is observed by scanning electron microscopy. It was furthermore observed during the development of the invention that, for a high fluence F, an open porosity forms at the surface 100 of the substrate 1. The laser annealing treatment is preferably carried out at a fluence F chosen in the third regime 22, that is to say the high-fluence F regime, so as to obtain a porous portion 12' with a high Haze. According to this example, a fluence F greater than 3 J/cm² may be chosen for a substrate 1 comprising a layer 10 of crystalline silicon.

This calibration curve can be obtained for other parameters of implantation in a silicon-based substrate, and for other substrates 1, and in particular for layers 10 comprising other semiconductor materials. A high-fluence F regime is preferably chosen, so as to obtain a porous portion 12' with a high Haze, for all the semiconductor materials.

Furthermore, following the laser annealing, the method may comprise a surface treatment of the porous portion 12', not shown in the figures. In particular, a thermal oxidation of the inner surface of the porous portion 12' may be performed. A dielectric material or a semiconductor material may be deposited on the inner surface of the porous portion 12'. In the case of the deposition of a semiconductor material, such as silicon or germanium, deposition by epitaxy will be preferred. For a high fluence F, as an open porosity forms on the surface 100 of the substrate 1, a treatment of the inner surface of the porous portion 12' with at least one reactive species is facilitated.

Figure 6A:
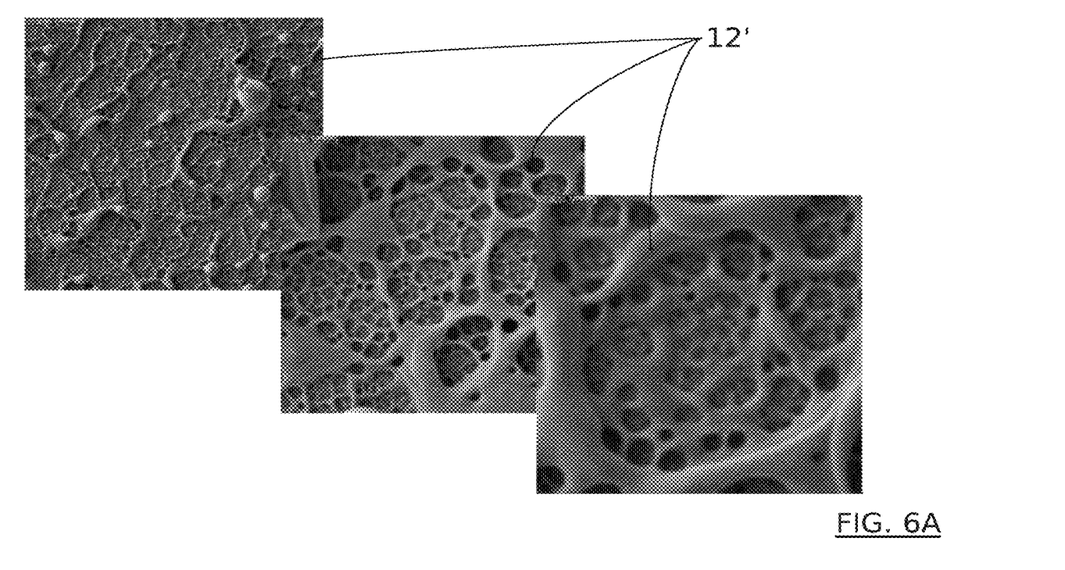
FIGS. 6A to 6E show a plan view in scanning electron microscopy of various porous portions of a layer, obtained according to several embodiments of the method according to the invention.

A few examples of scanning electron microscopy images of porous portions 12' obtained in accordance with a plurality of embodiments of the method, from a silicon layer, are now described with reference to FIGS. 6A to 6E. According to a first example, the porous portion 12' obtained for an implantation of helium ions at 52 keV, at a dose of $4.10^{14}$ ions/cm², followed by a laser annealing with a pulse duration of 160 ns, at a fluence F=3.1 J/cm², is illustrated in FIG. 6A. According to this example, the strong texturing of the surface obtained after the laser annealing in a high-fluence F regime can particularly be observed.

Figure 6B:
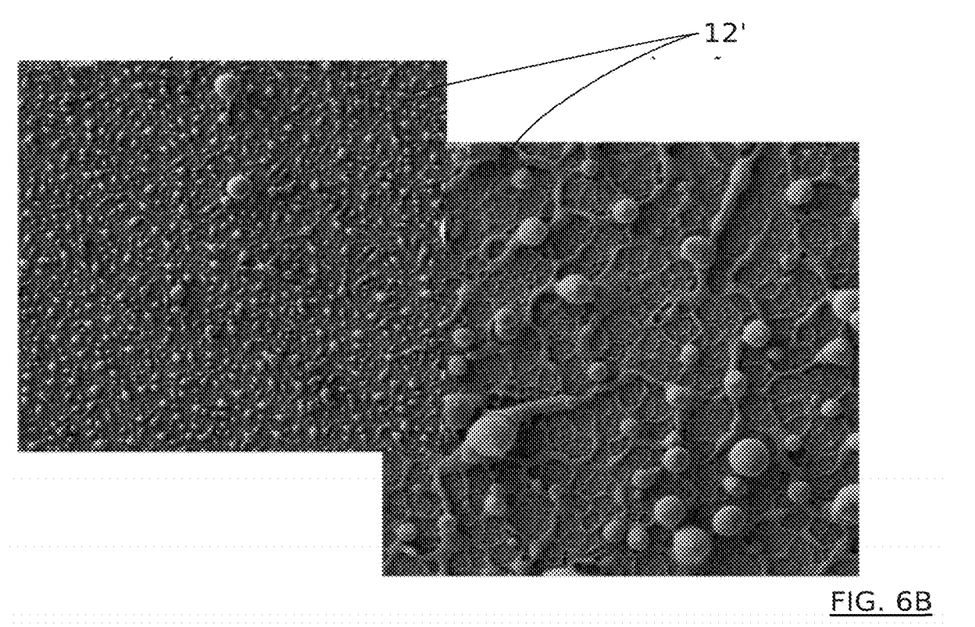

According to a second example, a different porous portion 12' is obtained for an implantation of helium ions at 52 keV, at a dose of $4.10^{14}$ ions/cm², followed by a laser annealing with a pulse duration of 160 ns, at a fluence F=3.2 J/cm², is illustrated in FIG. 6B.

Figure 6C:
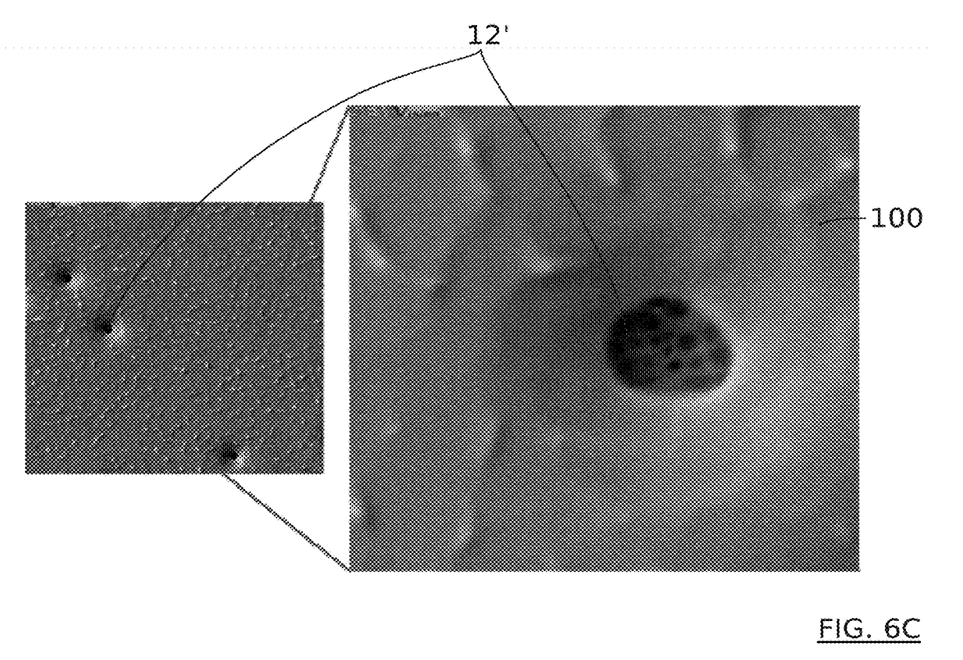

According to a third example illustrated in FIG. 6C, it can be observed that, for certain conditions of the method, and in particular for an excessively low fluence F of the laser annealing, the surface 100 of the layer 10 is not textured. A buried porous portion 12' is then formed, that is to say a porous portion 12' with closed porosity is formed, for example after an implantation of helium ions at 52 keV, at a dose of $15.10^{15}$ ions/cm², followed by a laser annealing with a pulse duration of 160 ns, at a fluence F=2.5 J/cm². Provision can be made for a second laser annealing to be able to be performed subsequently, for example at a higher fluence, in order to obtain the porous portion 12'.

Figure 6D:
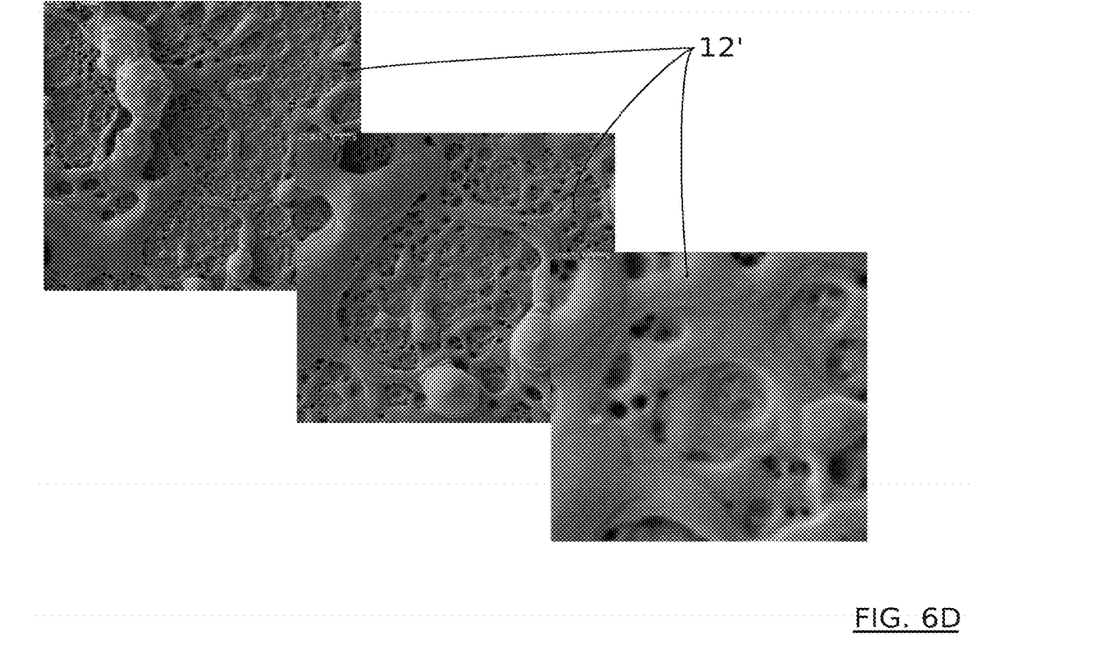

According to a fourth example, the porous portion 12' obtained after an implantation of helium ions at an energy of between 30 and 40 keV, at a dose of $4.10^{16}$ ions/cm², followed by a laser annealing with a pulse duration of 160 ns, at a fluence F=3 J/cm², is illustrated in FIG. 6D.

Figure 6E:
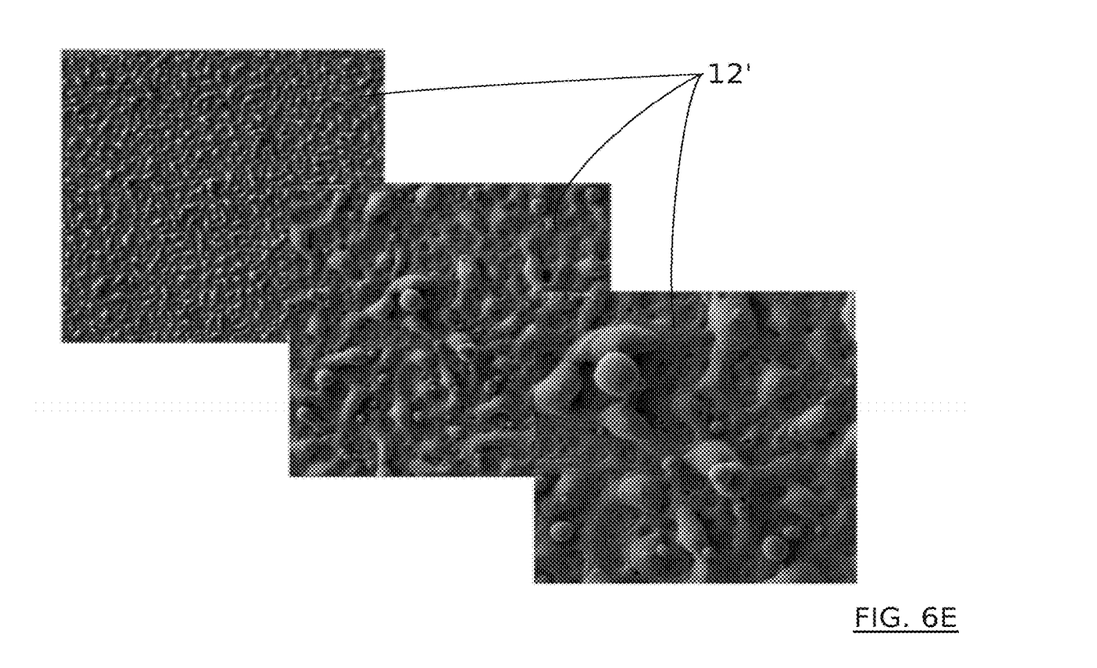

According to a fifth example, the porous portion 12' obtained after an implantation of helium ions at an energy of between 30 and 40 keV, at a dose of $4.10^{16}$ ions/cm², followed by laser annealing with a pulse duration of 160 ns, at a fluence F=3.1 J/cm², is illustrated in FIG. 6E.

Figure 7:
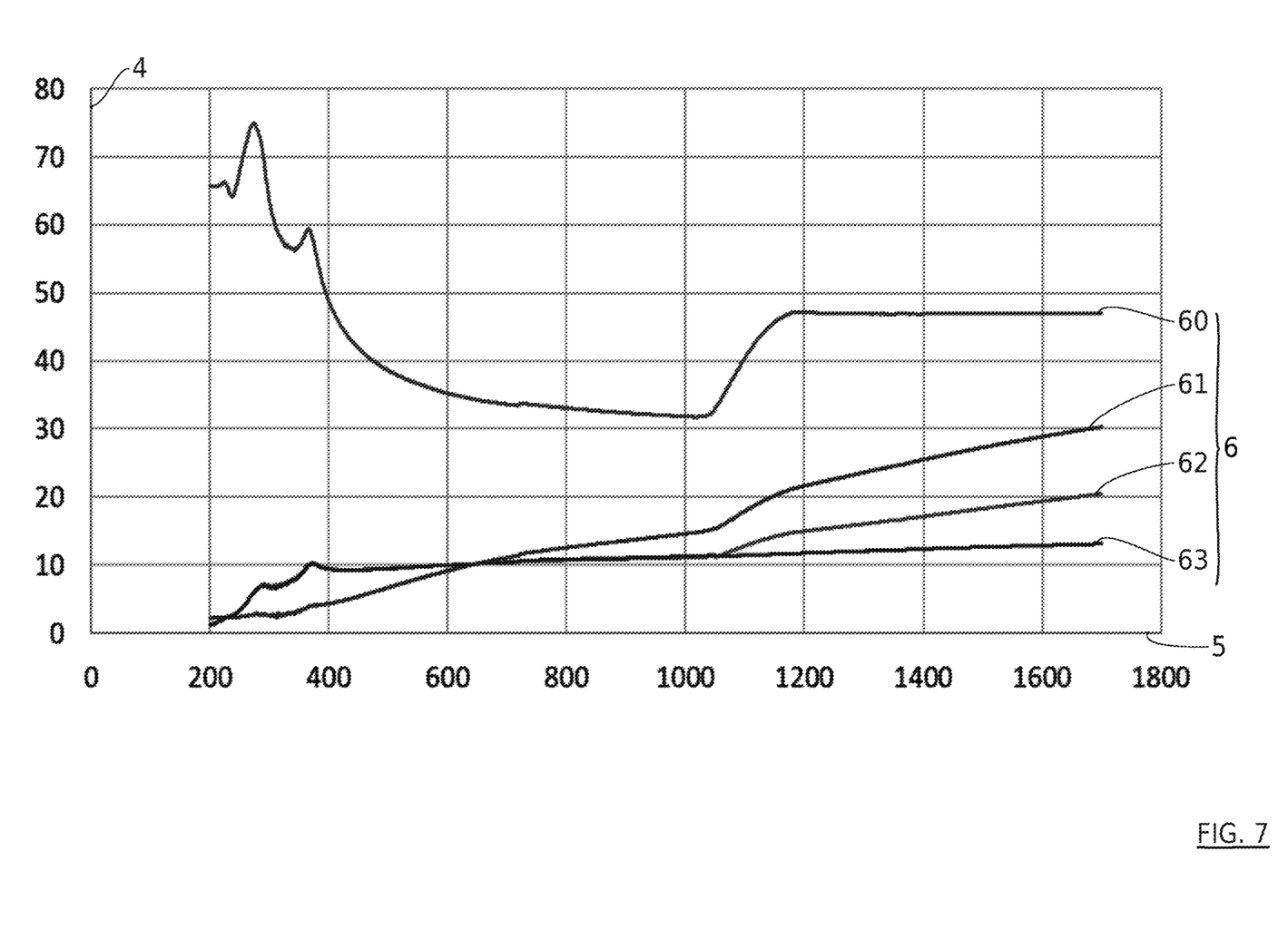
FIG. 7 shows a graph of the reflectivity at an angle of incidence of 7°, as a function of the wavelength of the incident light, measured for various reference substrates, and various porous portions obtained according to several particular embodiments of the invention.

The reflectivity properties for various reference substrates, and various porous portions 12' obtained in accordance with a plurality of particular embodiments of the invention, are now illustrated with reference to FIGS. 7 and 8. FIG. 7 shows a graph of the reflectivity at an angle of incidence of 7°, as a function of the wavelength of the incident light, measured for:
- a superficial layer of silicon 60,
- a superficial layer of silicon implanted after laser annealing (F=3.3 J/cm²) 61,
- a superficial layer of silicon implanted after laser annealing (F=3.15 J/cm²) 62,
- a superficial layer of silicon implanted after laser annealing (F=3.15 J/cm²) 63, in this sample the surface at the rear face of the substrate was roughened in order to prevent parasitic reflections coming from the rear face.

The superficial layers of implanted silicon that have undergone laser annealing, corresponding to the layers 62 to 63, have the lowest reflectivities, these reflectivities being significantly lower than a reference superficial layer of silicon 60. For the layer 61, an annealing fluence of 3.3 J/cm² makes it possible to obtain the lowest reflectivity values in the visible domain. For a spectrum of wavelengths from 200 to 1800 nm, it does appear however that a fluence of 3.15 J/cm² makes it possible to obtain lower reflectivity values beyond 650 nm.

This reduction in the reflectivity observed on the various porous portions 12' obtained in accordance with a plurality of particular embodiments of the invention, can in particular be explained by the wide range of pore diameters of each porous portion 12'. Each porous portion 12' can thus interact with the extended range of wavelengths, which causes a reduction in the reflectivity.

Figure 8:
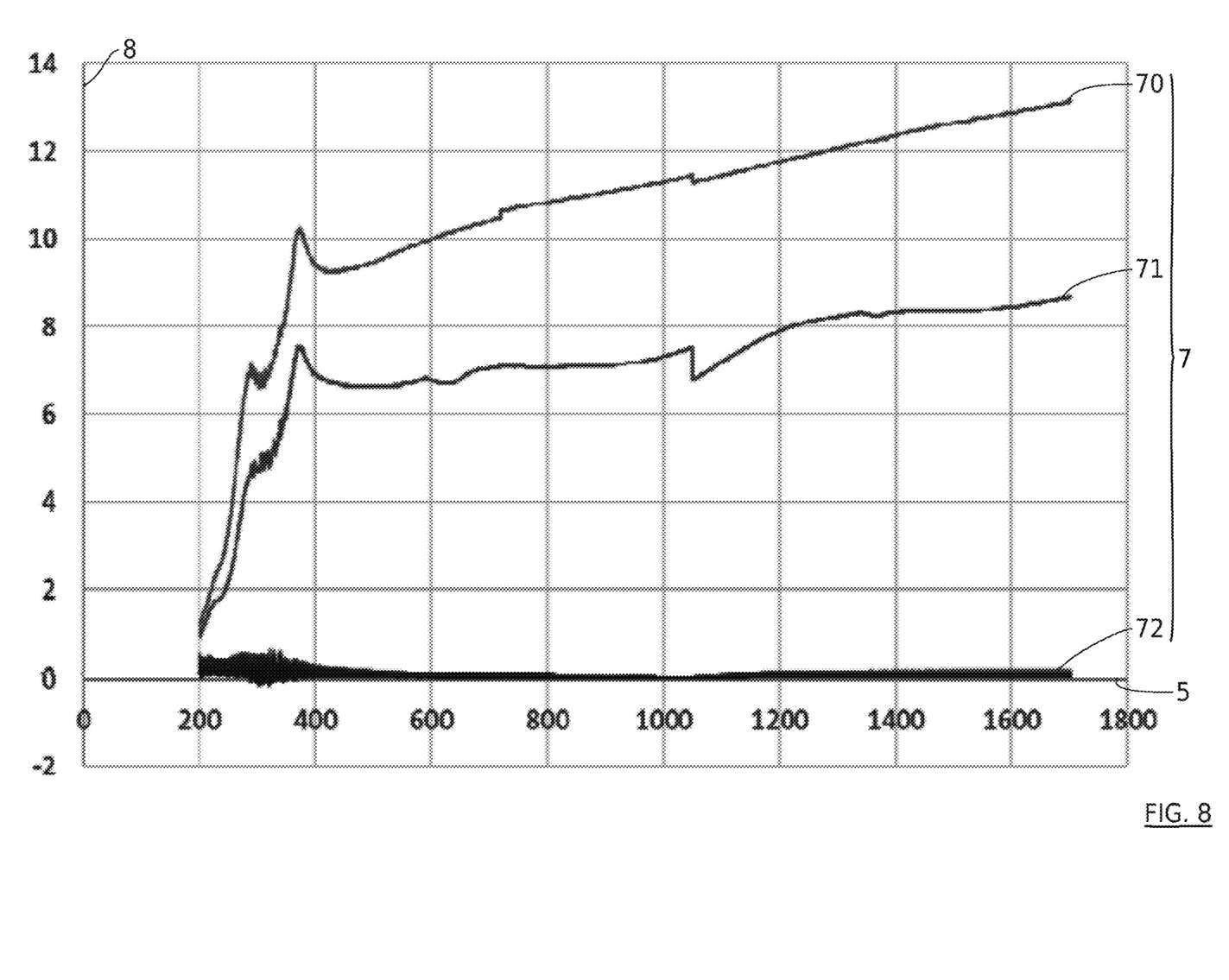
FIG. 8 shows a graph of the reflectivity measured at several angles of incidence, for a porous silicon portion according to a particular embodiment of the invention illustrated in FIG. 7.

FIG. 8 shows a graph of the reflectivity measured according to a plurality of angles of incidence, for the superficial layer of silicon implanted after laser annealing (F=3.15 J/cm$^2$), and roughened on the rear face in order to prevent parasitic reflections, at:

an angle of incidence of 7° for the curve 70,
an angle of incidence of 12° for the curve 71,
angles of incidence of between 17° and 62° for the curves 72.

For an angle of incidence greater than 12°, the reflectivity of the layer 72 is approximately zero, which clearly validates the potential of the method for obtaining black silicon, for example for applications in photovoltaics.

In the light of the above description, it is clear that the invention proposes an improved method for forming a porous portion based on a semiconductor material. In particular, the method being compatible with various semiconductor materials, various implanted ions, and having numerous parameters able to be modulated, the method makes it possible to obtain porous portions based on a semiconductor material, having various structures. The method makes it possible to modulate the structure and the properties of the porous portion based on semiconductor.

The invention is not limited to the embodiments described above and extends to all embodiments covered by the claims.

LIST OF REFERENCES

1 Substrate
10 Layer based on a semiconductor material
100 Surface
101 Fraction
11 Implanted region
11a First implanted region
11b Second implanted region
110 Microstructure
110a *First microstructure*
110b Second microstructure
12 Portion
12a First portion
12b Second portion
12' Porous portion
13 Mask
2 Haze (H)
20 Low-fluence regime
21 Intermediate regime
22 High-fluence regime
3 Fluence (F, in J/cm$^2$)
4 Reflectivity at an angle of incidence of 7° (as %)
5 Wavelength (in nm)
6 Curves of the reflectivity at 7° of incidence, for
60 A superficial layer of silicon
61 A superficial layer of silicon implanted after laser annealing (F=3.3 J/cm$^2$)
62 A superficial layer of silicon implanted after laser annealing (F=3.15 J/cm$^2$)
63 A superficial layer of silicon implanted after laser annealing (F=3.15 J/cm$^2$), where the surface on the rear face of the substrate has been roughened
7 Curves of the reflectivity at d of incidence for a superficial layer of silicon implanted after laser annealing (F=3.15 J/cm$^2$), at
70 An angle of incidence of 7°
71 An angle of incidence of 12°
72 Angles of incidence of between 17° and 62°
$E_1$ First thickness
$E_2$ Second thickness
P Implantation depth
$P_1$ First implantation depth
$P_2$ Second implantation depth

The invention claimed is:

1. A method for forming a porous portion in a substrate, the method comprising:
   provision of a substrate comprising a layer, and having a surface,
   an implantation of ions chosen from hydrogen ions and noble gas ions in at least one region of the layer, the implanted region being situated at an implantation depth in the layer, so as to form at least one portion enriched with at least one gas in the implanted region, and then
   a laser annealing of the nanosecond type so as to bring about, from the implanted region, at least one from among formation and development of a porous portion at the surface of the substrate, the porous portion comprising pores having an inner surface,
   wherein the laser annealing of the nanosecond type causes at least one from the formation and the development of a porous portion on the surface of the substrate, and
   wherein the method comprises a surface treatment of the porous portion comprising a thermal oxidation of the inner surface of the pores of the porous portion or a deposition of a dielectric material or of a semiconductor material, on said inner surface.

2. The method according to claim 1, wherein, during the ion implantation, a mixture of ions of distinct chemical elements is implanted so as to form a portion enriched with a plurality of gases.

3. The method according to claim 1, wherein, during the ion implantation, the ions are chosen from hydrogen ions and noble-gas ions, the noble-gas ions being chosen from helium, neon, argon and xenon ions.

4. The method according to claim 1, wherein the ion implantation is performed at a temperature of between −200° C. and 1200° C.

5. The method according to claim 1, the method further comprising a thermal annealing with the implantation of ions and laser annealing.

6. The method according to claim 5, wherein the thermal annealing is performed at a temperature higher than an ion-implantation temperature.

7. The method according to claim 1, the method further comprising applying a mask to a fraction of an exposed surface of the substrate prior to the ion implantation, and a removal of the mask after the ion implantation.

8. The method according to claim 1,
   wherein the method comprises a plurality of ion implantations.

9. The method according to claim 8, wherein the chemical elements of the ions and/or the relative proportions between ions of distinct chemical elements vary between the ion implantations.

10. The method according to claim 8, wherein at least one from the plurality of ion implantations is performed at an implantation depth that is different with respect to the implantation depths of the other ion implantations.

11. The method according to claim 8, wherein at least one from the plurality of ion implantations is configured to implant a different dose with respect to the implanted doses of the other ion implantations.

12. The method according to claim 1, wherein the laser annealing of the nanosecond type is implemented at a predetermined energy density, the predetermined energy density being chosen using a curve representing, as a function of the energy density, a signal proportional to a roughness, the curve presenting at least one increase in said signal for an energy density range, the predetermined energy density being chosen from this range.

13. The method according to claim 1, wherein the laser annealing is performed at a wavelength of between 200 nm and 400 nm.

14. The method according to claim 1, wherein the laser annealing may comprise laser pulses having a duration of between 1 ns and 1000 ns.

15. The method according to claim 1, wherein the layer is based on a semiconductor material.

16. The method according to claim 15, wherein the semiconductor material is based on monocrystalline silicon.

17. The method according to claim 16, wherein the implantation of ions chosen from hydrogen ions and helium ions is performed at an implantation energy of between 30 and 40 keV, for an implanted dose of between $1.10^{16}$ atoms/$cm^2$ and $5.10^{16}$ atoms/$cm^2$ and wherein the laser annealing is performed at a fluence higher than 3 J/$cm^2$.

18. The method according to claim 8, wherein the implantation of ions chosen from hydrogen ions and helium ions is performed at an implantation energy of between 30 and 40 keV, for an implanted dose of between $1.10^{16}$ atoms/$cm^2$ and $5.10^{16}$ atoms/$cm^2$ and wherein the laser annealing is performed at a fluence higher than 3 J/$cm^2$.

19. The method according to claim 1,
wherein the method comprises a plurality of ion implantations.

20. The method according to claim 19, wherein the chemical elements of the ions and/or the relative proportions between ions of distinct chemical elements vary between the ion implantations.

* * * * *